(12) United States Patent
Cai et al.

(10) Patent No.: US 8,534,866 B2
(45) Date of Patent: Sep. 17, 2013

(54) LED LIGHT SOURCE

(75) Inventors: Zou Cai, Guangdong (CN); Jun Zou, Guangdong (CN); Xuehua Mao, Guangdong (CN)

(73) Assignee: Zhou Cai, Shenzhen, Guangdong (CN)

( * ) Notice: Subject to any disclaimer, the term of this patent is extended or adjusted under 35 U.S.C. 154(b) by 135 days.

(21) Appl. No.: 13/068,162

(22) Filed: May 3, 2011

(65) Prior Publication Data

US 2011/0273863 A1  Nov. 10, 2011

(30) Foreign Application Priority Data

May 4, 2010 (CN) .......................... 2010 1 0172360

(51) Int. Cl.
*F21V 9/00* (2006.01)
(52) U.S. Cl.
USPC ............... 362/231; 362/234; 362/84; 257/98; 257/100; 313/498

(58) Field of Classification Search
USPC .............. 362/231, 235, 84, 294; 257/98–100
See application file for complete search history.

(56) References Cited

U.S. PATENT DOCUMENTS 8,148,746 B2 * 4/2012 Kobayakawa ................. 257/99
2010/0072496 A1 * 3/2010 Kobayakawa ................. 257/91

* cited by examiner

*Primary Examiner* — Ali Alavi
(74) *Attorney, Agent, or Firm* — Raymond Y. Chan; David and Raymond Patent Firm (57) ABSTRACT

A LED light source includes: a LED member having a first light emitting surface and a second light emitting surface opposite of the first light emitting surface, a first fluorescent member provided on the first light emitting surface, and a second fluorescent member provided on the second light emitting surface. The LED light source is capable of greatly increasing the light emitting efficiency and reducing the cost and complexity of the heat dissipation construction.

8 Claims, 14 Drawing Sheets

LED LIGHT SOURCE

CROSS REFERENCE OF RELATED APPLICATION

This is a non-provisional application that claims the benefit of priority under 35 U.S.C. §119 to a non-provisional application, application number CN201010172360.1, filed May 4, 2010.

BACKGROUND OF THE PRESENT INVENTION

1. Field of Invention

The present invention relates to a light source, more particularly to a LED light source.

2. Description of Related Arts

The conventional LED light source requires effective heat dissipating device for heat dissipation to function effectively. Usually, the heat dissipation mechanism or arrangement involves natural heat convection, addition of cooling fan device, addition of heat pipe, construction of heat sink structure and so on. The cooling fan device is complicated but of relative low reliability, and it often turns out that the life span of the cooling fan device is shorter than a chip; The heat pipe has a relative low rate of heat dissipation; the heat sink structure is limited by the surface area of its fins structure and thus fail to solve the problem of heat dissipation satisfactorily.

Conventional LED light source is a sealed structure, comprising a substrate serving as a base and a LED member having one side bonded to the substrate and another side for light emission. In addition, resin is used to encapsulate the LED member in such a manner that the LED member is affixed onto the substrate.

Currently, the problem of LED heat dissipation is one of the major issues in developing LED into the modern light source. The design and construction of the LED heat dissipation arrangement directly and greatly determines the life span, functionality, and cost of the LED light source. In addition, the conventional LED light source only provides one light emitting surface while the other bonded surface is limited onto the substrate and cannot be used, resulting in a relatively low lighting intensity and efficiency.

SUMMARY OF THE PRESENT INVENTION

The invention is advantageous in that it provides a LED light source which greatly increase the lighting efficiency, decrease the design difficulty and lowers the cost of manufacture.

Additional advantages and features of the invention will become apparent from the description which follows, and may be realized by means of the instrumentalities and combinations particular point out in the appended claims.

According to the present invention, the foregoing and other objects and advantages are attained by a LED light source comprising: a LED member having a first light emitting surface and a second light emitting surface opposite of the first light emitting surface, a first fluorescent member provided on the first light emitting surface, and a second fluorescent member provided on the second light emitting surface.

Wherein the first fluorescent member is a fluorescent colloid and the second fluorescent member is a fluorescent chip and vice versa; or both the first fluorescent member and the second fluorescent member are fluorescent colloids or fluorescent chips.

Preferably, both the first fluorescent member and the second fluorescent member are fluorescent chips, the LED light source comprises one or more LED members, wherein a plurality of LED members are electrically connected in parallel or in series and sandwiched between the two fluorescent members, and are horizontally and spaciously aligned in such a manner that a heat passage is defined between two adjacent LED members for heat dissipation.

Preferably, the first fluorescent member and the second fluorescent member are two fluorescent chips parallelly aligned to each other, wherein the LED member has a flip-chip construction or a standard chip construction without light reflecting layer so that the LED member is capable of providing light emission via both sides thereof.

Preferably, the LED member having the standard chip construction is retained between the two fluorescent members via a retention member, wherein the retention member is positioned between the two fluorescent members and comprises two position members at two distal ends clipping the LED member 10 in such a manner that the LED member is suspended between the two fluorescent members; or a facet without doping unit of the LED member having the flip chip construction is molecular bonded to one of the two fluorescent members, or the LED member having the flip chip construction is fixed to a surface of one of the fluorescent members by die attach epoxy with high light transmission ability and good conductivity.

Preferably, a plurality of the LED members are spacedly provided between the two fluorescent members, wherein a bonding member is peripherally sealed at the peripheral edges of the fluorescent members so as to retain the LED members between the two fluorescent members, wherein a plurality of passage openings are spacedly formed along the bonding member for allowing heat transfer away from the LED members, wherein the fluorescent members comprise a plurality of support members orderly provided between every two adjacent LED members along a surface thereof to retain the LED members in position, wherein an inner gas is used to fill the space between the two fluorescent members.

Preferably, the bonding member is a silica gel which is reflective and comprises an electrode member, the LED members are electrically connected in series or in parallel and the LED members are electrical connected to the electrode member through a gold wire or a copper wire electrically connected to the electrode member, so that p-type doping units and n-type doping units of the two adjacently positioned the LED members are electrically connected.

Preferably, the LED light source further comprises two position members at two distal ends thereof for clipping the two fluorescent members in position respectively.

Preferably, the LED light source is constructed into a LED light bulb structure comprising a shell body defining a shell cavity having the inner gas inside the shell body, wherein the fluorescent members and the LED members are supported within the shell cavity of the shell body to form a LED light bulb, wherein a space between the fluorescent members are communicated outside to the shell cavity of the shell body through the passage openings.

Preferably, the LED light source further comprises a light reflective member extended sidewardly from one side of the fluorescent members at a position spacedly extending along the LED light source in such a manner that light emitted from the LED members is guided through a reflective surface of the reflective member to project at a predetermined direction.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
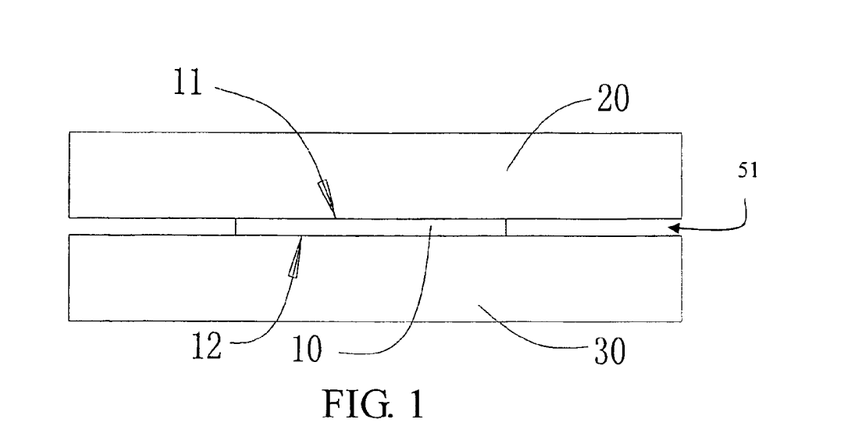
FIG. 1 is a cross-section illustration of a LED light of a preferred embodiment of the present invention.

Referring to FIG. 1 of the drawing, according to a preferred embodiment of the present invention, a LED light source comprises:

A LED member 10 having a first light emitting surface 11 and a second light emitting surface 12; and first and second fluorescent members 20, 30 provided on the first and second light emitting surfaces 11, 12 respectively.

Accordingly, the LED member 10 is provided with fluorescent members on both two sides thereof for light emission, so that at least 30% of the light energy utilizing capability can be achieved; in addition, the LED member 10 is not affixed onto a heat dissipation substrate so that this spared surface is capable of achieve heat dissipation via convection or radiation. Therefore, the construction of the heat dissipation structure is simplified and the heat dissipation performance is ensured.

In this preferred embodiment, the first fluorescent member 20 is a fluorescent colloid, and the second fluorescent member 30 is also a fluorescent colloid; or the first fluorescent member 20 is a fluorescent chip, and the second fluorescent member 30 is a fluorescent colloid; or the second fluorescent member 30 is a fluorescent chip, and the second fluorescent member 20 is a fluorescent colloid; or the first fluorescent member 20 is a fluorescent chip, and the second fluorescent member 30 is also a fluorescent chip.

The fluorescent chip may be employed as an affixing base of the LED member 10 for heat dissipation, and the heat transfer performance is guaranteed since the fluorescent chip has a small thickness.

The fluorescent chip may be made of Yttrium Aluminum Garnet (YAG) doped with various kinds of rare Earth elements. The YAG can be obtained through quantum cutting.

Figure 2:
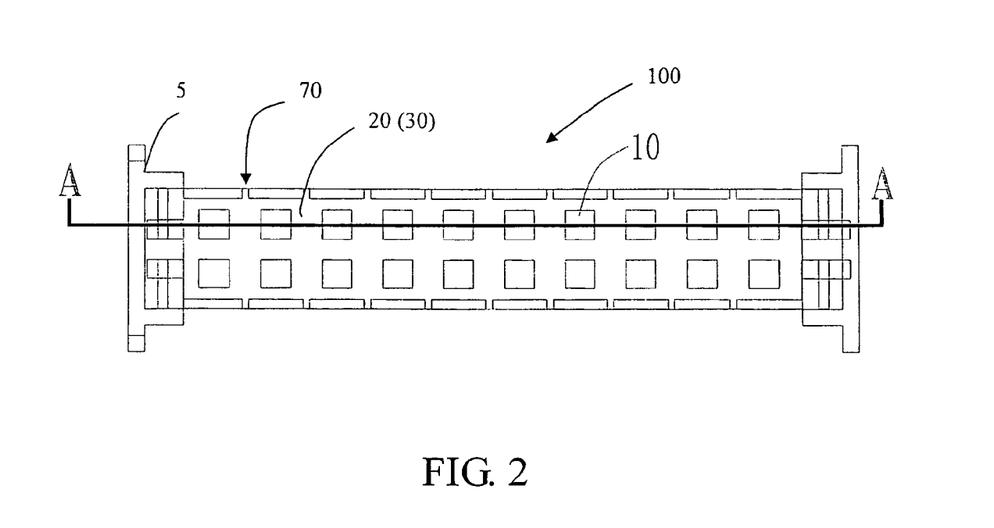
FIG. 2 is a top view illustration of an alternative of the LED light of the above preferred embodiment of the present invention.
Figure 3:
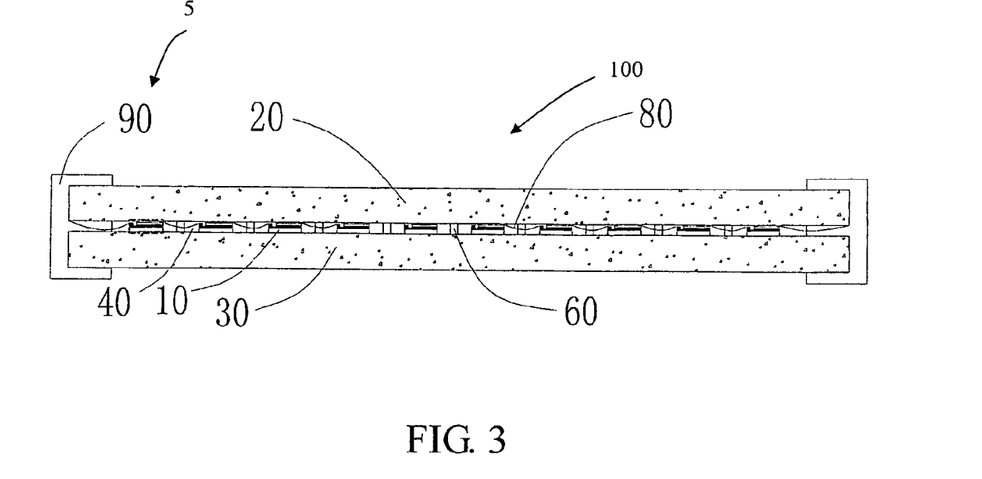
FIG. 3 is an A-A cross-section illustration of the alternative of the LED light of FIG. 2 of the above preferred embodiment of the present invention.

Referring to FIG. 2 and FIG. 3 of the drawings, in another preferred embodiment, both the first fluorescent member 20 and the second fluorescent member 30 are fluorescent chips, the quantity of the LED member 10 can be one or more, wherein a plurality of LED members 10 can be electrically connected in parallel or series and sandwiched between the two fluorescent members, and are horizontally and spaciously aligned in such a manner that a heat passage 40 is defined between two adjacent LED members for heat dissipation.

In the above preferred embodiment, it is worth mentioning that the fluorescent chip which has a rigid body forms a rigid support of the LED members 10, that the conventional support base (usually metal base, such as brass) of LED light source is eliminated, such that the lighting efficiency is increased while the overall size is reduced. The heat passage 40, which is provided between two adjacently positioned LED members, provides an effective and direct means for heat transfer away from the LED members 10. In the absence of resin-like materials encapsulating the LED members, together with the provision of heat passages 40, the heat dissipation can be effectively achieved, hence ensuring the proper functioning of the LED members 10 under a controlled and lowered temperature and increasing the lifespan.

In another preferred embodiment, both the first fluorescent member 20 and the second fluorescent member 30 are two fluorescent chips parallelly aligned to each other, wherein each LED member 10 has a flip chip construction or a standard chip construction (non flip-chip) without light reflecting layer so that the LED member is capable of providing light emitting via both sides thereof.

Figure 4:
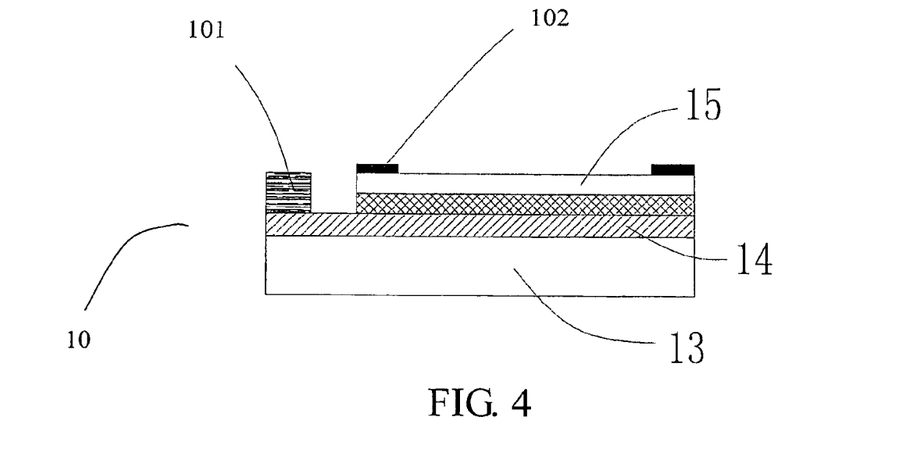
FIG. 4 is a cross-section illustration of a LED member of the LED light of the above preferred embodiment of the present invention.

Referring to FIG. 2, FIG. 3 and FIG. 4 of the drawings, for a flip chip construction, i.e. the P-type doping unit and the N-type doping unit are positioned at a same facet of the LED member 10, wherein another facet without doping unit is molecular bonded to one of the two fluorescent chips, or the flip chips are electrically connected in parallel or series after being fixed to the surface of the fluorescent chip by die attach epoxy with high light transmission ability and good conductivity. For the standard chip construction, i.e. the P-type doping unit and the N-type doping unit are positioned at two opposite facets of the LED member 10, wherein the standard chip is retained between the two fluorescent chips via a retention member, wherein the retention member is positioned between the two fluorescent chips and comprises two position members at two distal ends clipping the LED member 10 in such a manner that the LED member 10 is suspended between the two fluorescent chips.

In particular, each of the LED members 10 has a flip-chip construction having six illuminative facets, and comprises a plurality of layers overlapped and arrayed in order, which are a rigid and transparent base layer 13, an illuminative layer 14 and a current dispersion layer 15 overlapped and arrayed in sequence, wherein one of the fluorescent chip is coupled with the base layer 13 and the other fluorescent chip is connected to the current dispersion layer 15, as shown in FIG. 4.

Accordingly, the flip chip construction of the LED member 10, which is simple in construction, is capable of providing two illuminative surfaces.

In another preferred embodiment, the rigid and transparent base layer 13 is a sapphire, wherein the sapphire is molecular bonded to the fluorescent chip.

Accordingly, the use of molecular bonding eliminates the need of conductive medium such as silica gel for heat transfer that is limited by the maximum heat transfer capacity of the conductive medium, thereby the present invention greatly increases the capacity of heat transfer and the effectiveness of heat dissipation for the LED members 10. It is worth mentioning that the base layer 13 can also be made of other materials provided that the base layer 13 is capable of being securely bonded onto the fluorescent chip The LED member 10 can be a light emitting object capable of providing illumination at two surfaces without employing a sapphire as a base. Wherein at least the second fluorescent member 30 is molecular bonded to the LED member 10. For example, the second fluorescent member 30, which is embodied as a fluorescent chip, is molecular bonded to a facet of the LED member 10, wherein the facet is free from any doping units. Since the LED member 10 is a semiconductor die directly molecular bonded to the second fluorescent member 30 so that the overall thickness is reduced, and thus the cost is reduced.

Figure 5:
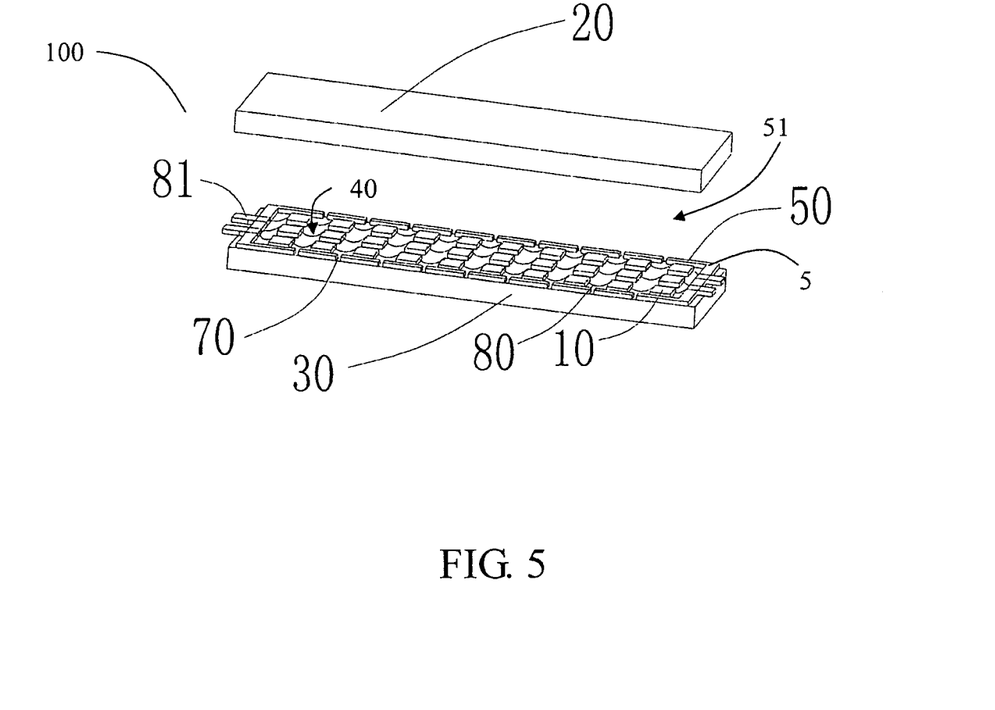
FIG. 5 is an illustration of the construction relationship between a LED member and two fluorescent members of the LED light of the above preferred embodiment of the present invention.

Referring to FIG. 3 and FIG. 5, in another preferred embodiment, a plurality of LED members 10 are spacedly provided between the two fluorescent chips, wherein a bonding member 50 is peripherally sealed at the peripheral edges of the fluorescent chips so as to retain the LED members 10 between the two fluorescent chips. A plurality of passage openings 70 are spacedly formed along the bonding member 50 for allowing heat transfer away from the LED members 10. Wherein the fluorescent chips comprise a plurality of support members 60 orderly provided between every two adjacent LED members 10 along a surface thereof to retain said LED members 10 in position. Furthermore, an inert gas such as helium and nitrogen having high heat conductivity is used to fill the space between the two fluorescent chips.

In this preferred embodiment, the space between the two fluorescent chips is used as a receiving cavity for the LED members 10, wherein the passage openings 70 are communicating with the receiving cavity to define a heat passage for directing heat transfer away from the LED members 10.

Preferably, the bonding member 50 is a silica gel which is reflective and comprises an electrode member 81, the current dispersion layer 15 includes a p-type doping unit 102, the illuminative layer 14 includes a n-type doping unit 101 at a side proximal to the current dispersion layer 15, the LED members 10 are electrically connected in series or in parallel and the LED members 10 are electrical connected to the electrode member 81 through a connecting element 80 such as a gold wire, a copper wire and so on. In particular, each two LED members 10 are electrically connected through the connecting element 80 which connects the p-type doping unit 102 and the n-type doping unit 101 of the two adjacently positioned LED members 10, and the LED member 10 which is positioned at an distal end are connected to the electrode member 81.

Referring to FIG. 3 of the drawing, the LED light source further comprises two position members 90 at two distal ends thereof for clipping the two fluorescent members 20, 30 in position respectively, as shown in FIG. 3. The use of position members 90, instead of the bonding member 50 as described above, allows direct contact of the LED members 10 to the two fluorescent members 20, 30, further optimizes the heat dissipation for the LED members 10.

The LED light source of the present invention is suitable to construct and arrange for different uses, for example, light bulb, emergency light, PAR light, automotive light, street lighting, subway lighting, indoor lighting and so on.

Figure 6:
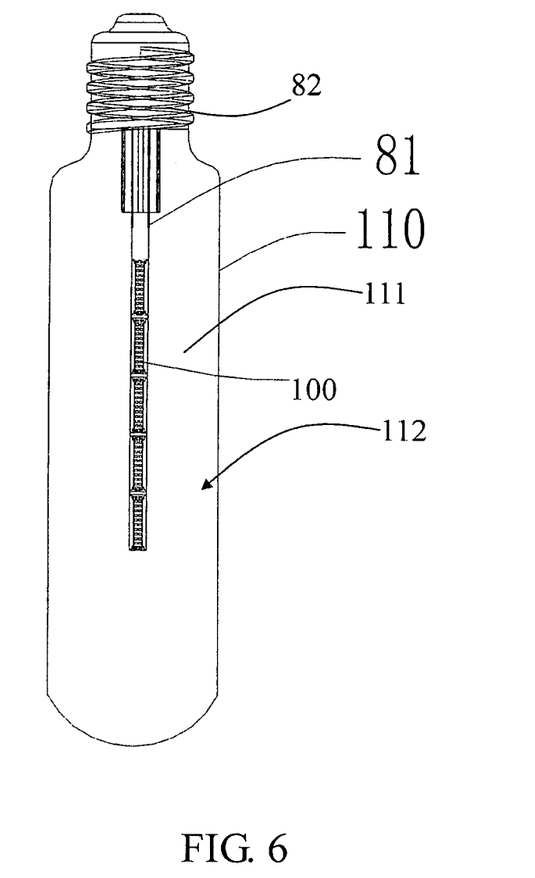
FIG. 6 is a side view illustration of another alternative of the LED light of the above preferred embodiment of the present invention.

Referring to FIG. 6 of the drawing, in a preferred embodiment, the LED light source of the present invention is constructed into a LED light bulb structure comprising a shell body 110 defining a shell cavity having an filled gas inside the shell body 110, wherein the fluorescent chips and the LED members 10 are supported within the shell cavity of the shell body 110 to form a LED light bulb, the space between the two fluorescent chips are communicated outside to the shell cavity of the shell body through the passage openings 70.

Accordingly, the filled gas, which can be an inert gas, is acted as an intermediate between the LED member 10 and the shell body 110 in such a manner that all the surface area of the shell body 110 can be used for heat dissipation. As a result, the surface area available for heat dissipation is greatly increased, hence increasing the efficiency of heat dissipation. Meanwhile, the filled gas 112 is an inert gas surrounding the LED member 10, which is sealed inside the shell cavity of the shell body 110, thereby the LED member 10 is further protected against oxidation inside the shell cavity filled with the inert gas with longer lifespan and higher reliability.

Figure 7:
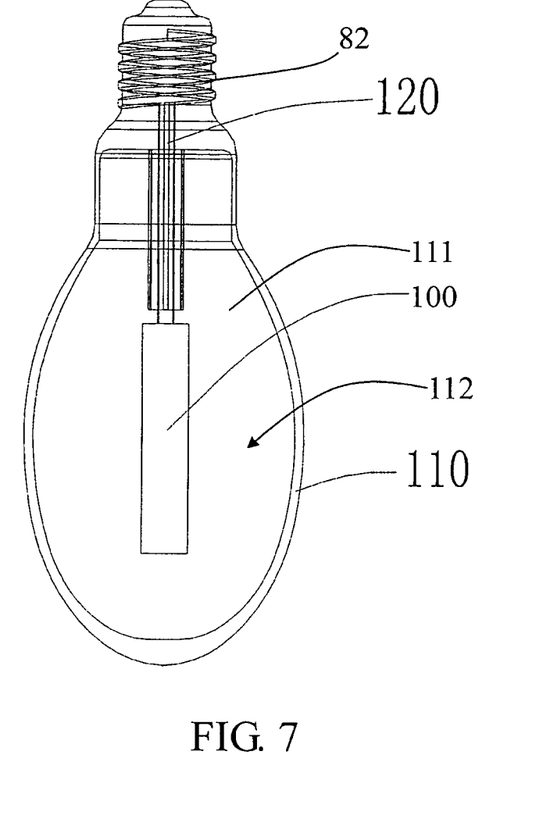
FIG. 7 is a side view illustration of another alternative of the LED light of the above preferred embodiment of the present invention.
Figure 8:
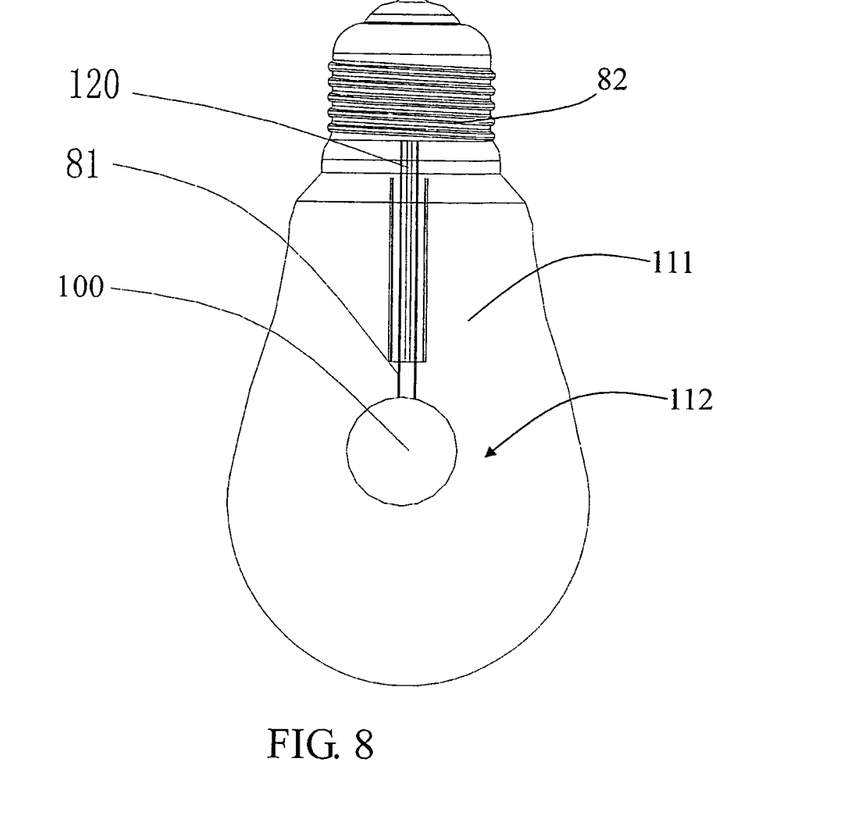
FIG. 8 is a side view illustration of another alternative of the LED light of the above preferred embodiment of the present invention.

Preferably, in another preferred embodiment, the LED light source may further comprise a conduit 120 connecting the fluorescent chips to the light bulb adapter of the shell body 110, as shown in FIGS. 7 and 8 of the drawings.

Figure 9:
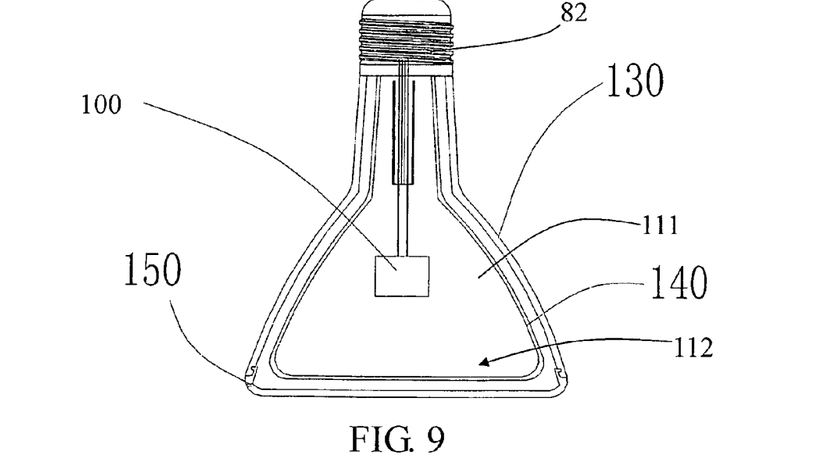
FIG. 9 is a side view illustration of another alternative of the LED light of the above preferred embodiment of the present invention.

Referring to FIG. 9 of the drawings, the LED light source of the present invention is constructed into a PAR light bulb. In particular, the PAR light bulb comprises a double-layered body defining a first body layer 130 as the outer layer and a second body layer 140 as the inner layer, defining a layer cavity between the two layers 130, 140 and a layer opening 150 communicating the layer cavity to outside.

Figure 10:
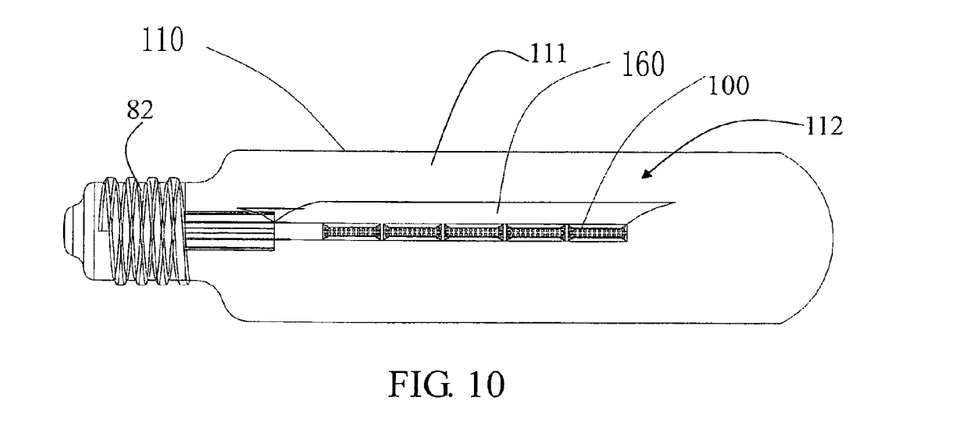
FIG. 10 is a side view illustration of another alternative of the LED light of the above preferred embodiment of the present invention.

Preferably, the LED light source of the present invention further comprises a light reflective member 160 extended sidewardly from one side of fluorescent chips at a position spacedly extending along the LED light source in such a manner that light emitted from the LED members 10 is guided through a reflective surface of the reflective member 160 to project at a predetermined direction, which is useful for providing a lighting effect at one direction.

Figure 11:
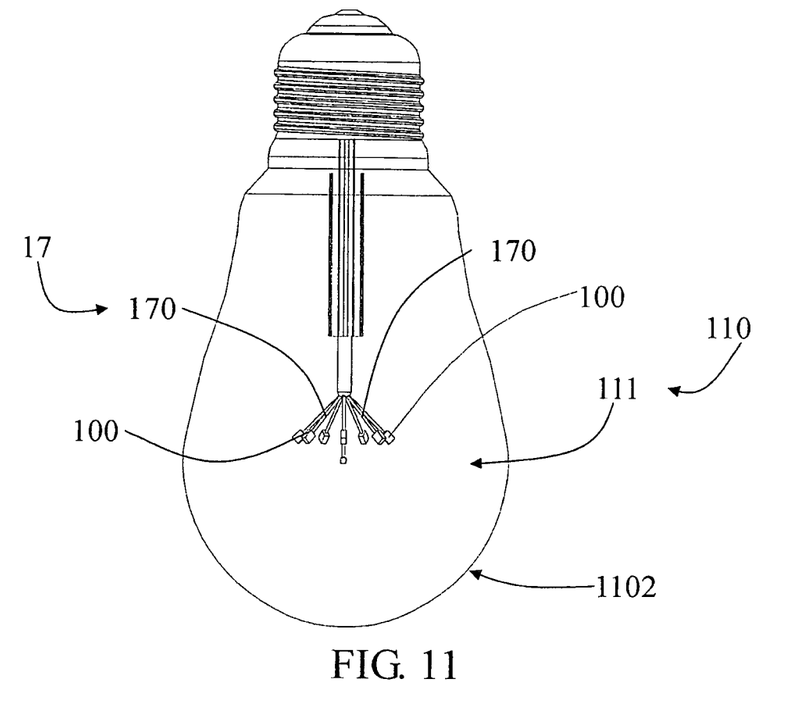
FIG. 11 is a side view illustration of another alternative of the LED light of the above preferred embodiment of the present invention.

Referring to FIG. 11 of the drawings, The LED light bulb further comprising a light effect construction having a plurality of connectors extending radially, each connected to one LED light source at one end, which is concentrically and outwardly extended from the shell body 110 in such a manner that the LED members 10 are orderly arranged in the center of the shell cavity for providing illumination effect.

Figure 12:
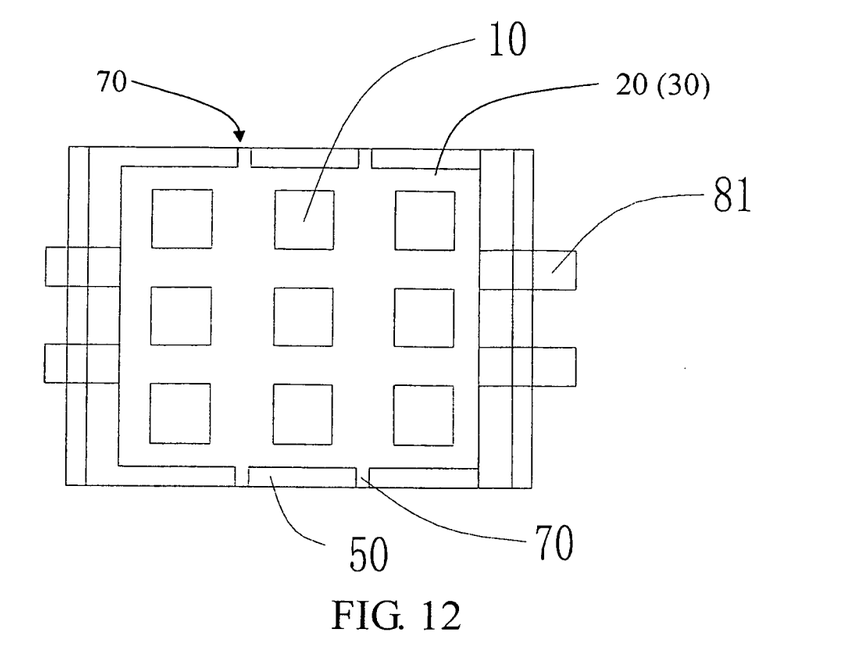
FIG. 12 is a top view illustration of another alternative of the LED light of the above preferred embodiment of the present invention.
Figure 13:
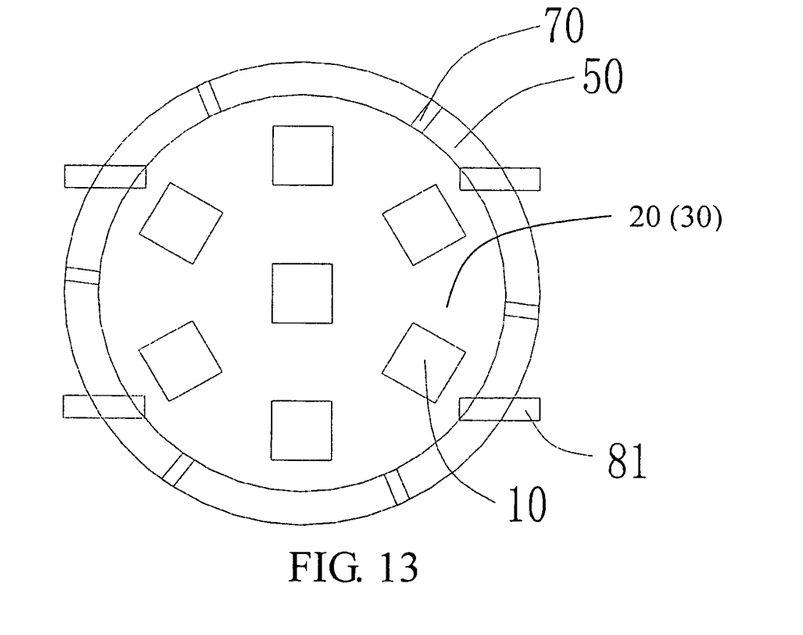
FIG. 13 is a top view illustration of another alternative of the LED light of the above preferred embodiment of the present invention.

The fluorescent chips are two identical rectangular, round or other shape fluorescent chips, as shown in FIG. 12 and FIG. 13.

Figure 14:
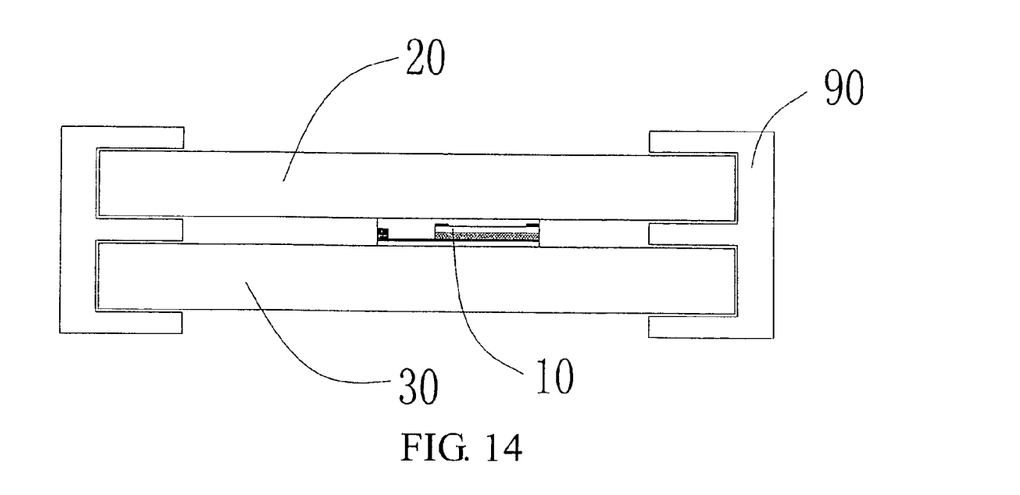
FIG. 14 is a side view illustration of another alternative of the LED light of the above preferred embodiment of the present invention.
Figure 15:
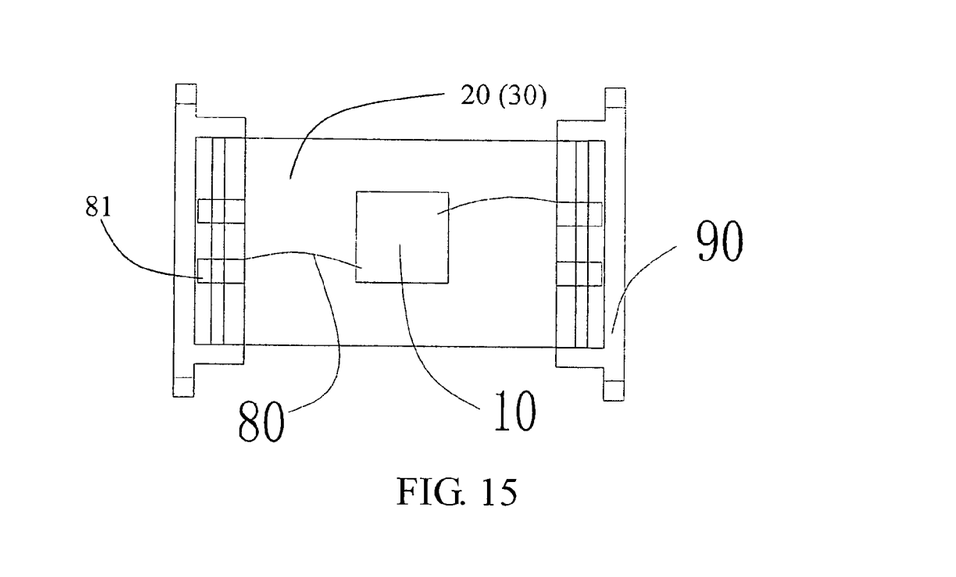
FIG. 15 is a top view illustration of the alternative of FIG. 14 of the LED light of the above preferred embodiment of the present invention.
Figure 16:
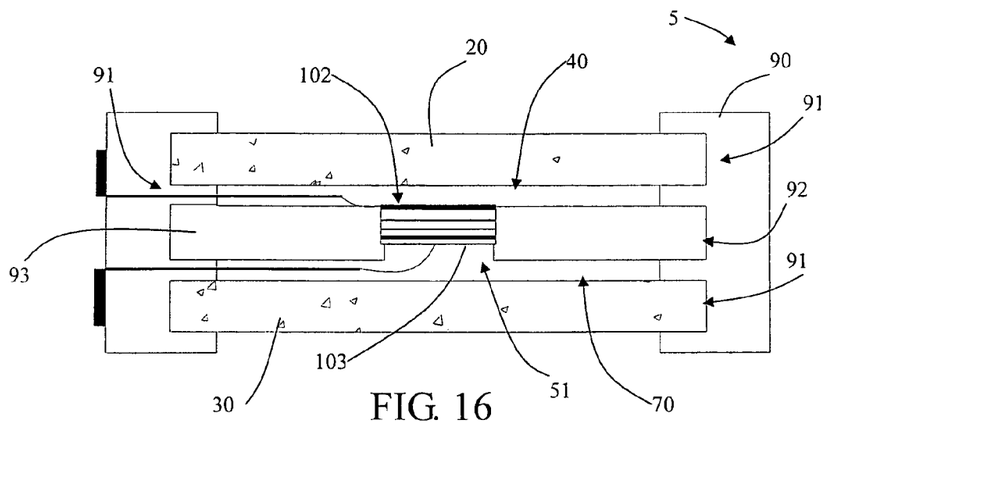
FIG. 16 is a cross-sectional illustration of another alternative of the LED light of the above preferred embodiment of the present invention.
Figure 17:
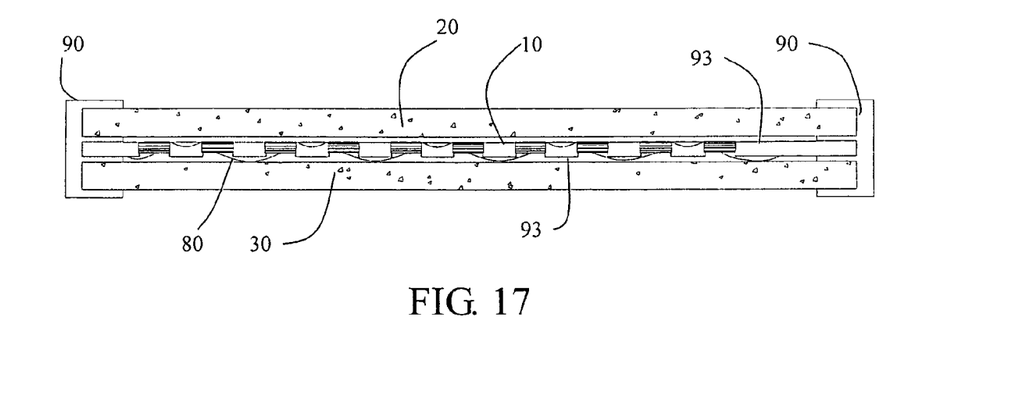
FIG. 17 is a cross-sectional illustration of another alternative of the LED light of the above preferred embodiment of the present invention.
Figure 18:
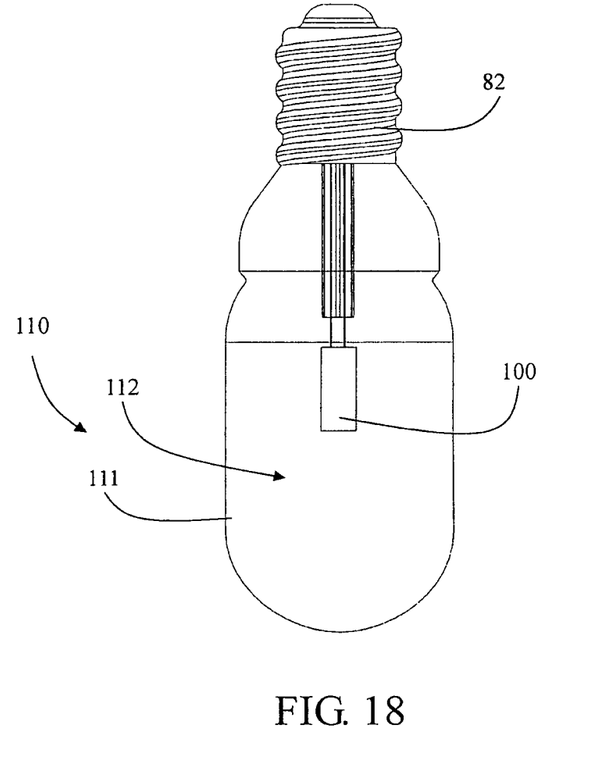
FIG. 18 is a side view illustration of another alternative of the LED light of the above preferred embodiment of the present invention.
Figure 19:
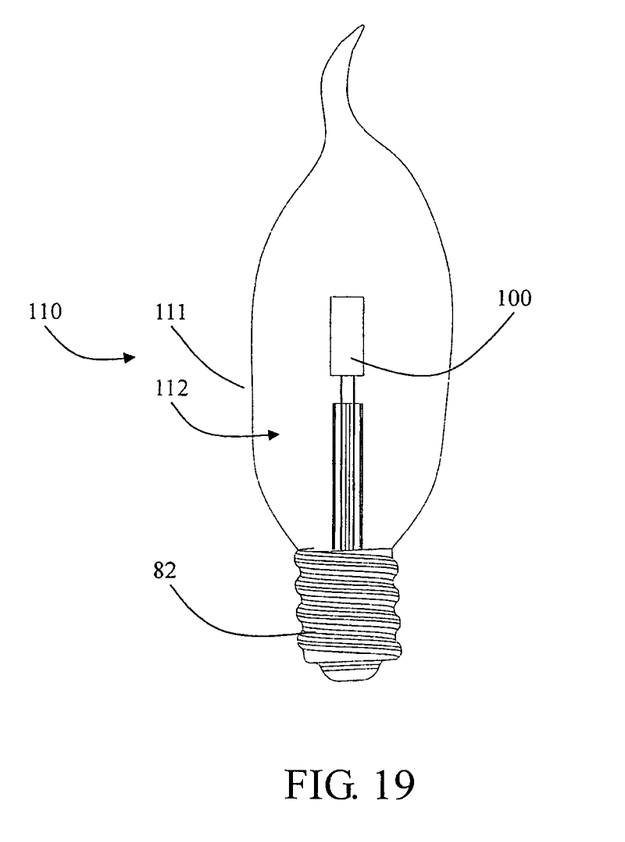
FIG. 19 is a side view illustration of another alternative of the LED light of the above preferred embodiment of the present invention.
Figure 20:
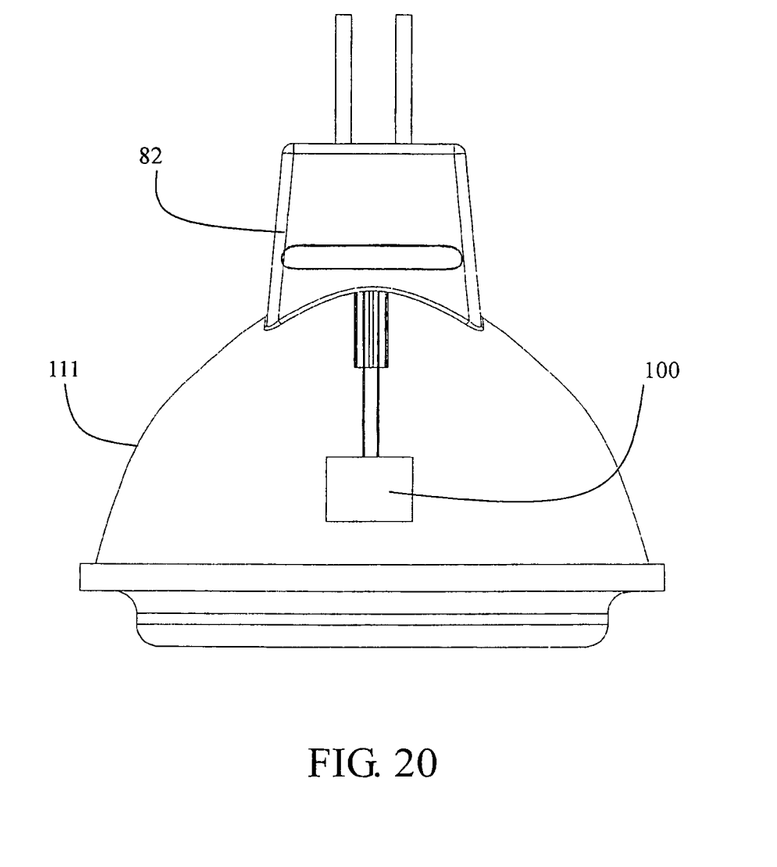
FIG. 20 is a side view illustration of another alternative of the LED light of the above preferred embodiment of the present invention.

Referring to FIG. 14 and FIG. 15 of the drawings, only one LED member 10 can be provided between the two fluorescent chips, wherein the LED light source further comprises two position members 90 at two distal ends clipping the two fluorescent chips in position. It is worth to mention that the LED member may not have a flip chip construction when the LED light source only has one LED member 10.

In addition, the LED light bulb can be configured to be multi-portion configuration, tapered configuration or flask configuration etc.

It is worth mentioning that, compared to conventional lighting fixture, the LED light source also emits heat while providing illumination and the heat produced, which substantially increases the environmental temperature, will significantly and adversely affect the lighting efficacy of the LED light source. In the conventional art, the lighting effect of a LED light source is produced by electroluminescence through the electrons and holes as affected by external energy provided through electricity at the p-n junction and that the lighting effect at the p-n junction has to pass through the semiconductor materials and the encapsulation materials of the LED light source itself to reach outside for providing the lighting effect. As a result, in view of the energy input and energy efficacy of energy input, the light radiation output and the light transmission efficacy, the percentage of energy conversion to light energy is only approximately 30% to 40% while that to heat energy is about 70%. Accordingly, the heat management is the key factor concerned for development in the conventional arts. Compared to the conventional arts, the present invention navigates the development to increasing lighting efficacy and reducing heat production, which is effective in solving the problem of low efficiency of LED light source.

The LED light source of the present invention, effectively avoiding the prejudice or the practice of the use of heat sink specialized for LED light sources in the conventional arts, makes use of the characteristics of electroluminescence which is capable of providing lighting effect on all sides, optimizing the use of the lighting effect on all sides such that the light efficacy is increased by 30% or above. At the same time, the present invention effectively solves the bottleneck problem in relation to heat dissipation induced by the conventional heat sink which serves as the major or sole channel for heat dissipation through providing an open area around the LED light source member and the provision of passages such that lighting efficacy as well as the efficiency of heat dissipation is greatly increased. In addition, the increased efficiency of heat dissipation has provided a lower environmental temperature which further optimizes the conditions for the electrons and holes to provide a highly effective lighting effect through electroluminescence, hence producing a cycle of high heat dissipation efficiency-high lighting efficacy-high heat dissipation efficacy. In a testing of the LED light source of the present invention, the percentage of energy conversion from electric energy to light energy can be 85% or above.

In addition, the additional use of filled inert gas around the LED members 10 for direct heat exchange has further lowered the environmental temperature of the LED members, and hence further increases the percentage of energy conversion from electric energy to light energy to 90% or above, which is a significant effect produced by the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A LED light source, comprising: at least a LED member having a first light emitting surface and a second light emitting surface opposite of the first light emitting surface; a first fluorescent member provided on the first light emitting surface; and a second fluorescent member provided on the second light emitting surface, wherein said first fluorescent member and said second fluorescent member are both fluorescent colloids; or said first fluorescent member is a fluorescent chip while said second fluorescent member is a fluorescent colloid; or said second fluorescent member is a fluorescent chip while said first fluorescent member is a fluorescent colloid; or said first fluorescent member and said first second fluorescent member are both fluorescent chips, wherein both said first fluorescent member and said second fluorescent member are fluorescent chips, wherein said LED light source comprises one or more LED members, wherein a plurality of LED members are electrically connected in parallel or in series and sandwiched between said two fluorescent members, and are horizontally and spaciously aligned in such a manner that a heat passage is defined between two adjacent LED members for heat dissipation.

2. A LED light source, comprising: at least a LED member having a first light emitting surface and a second light emitting surface opposite of the first light emitting surface; a first fluorescent member provided on the first light emitting surface; and a second fluorescent member provided on the second light emitting surface, wherein said first fluorescent member and said second fluorescent member are two fluorescent chips parallelly aligned to each other, wherein said LED member has a flip-chip construction or a standard chip construction without light reflecting layer so that said LED member is capable of providing light emission via both sides thereof.

3. The LED light source, as recited in claim 2, wherein said LED member having said standard chip construction is retained between said two fluorescent members via a retention member, wherein said retention member is positioned between said two fluorescent members and comprises two position members at two distal ends clipping said LED member 10 in such a manner that said LED member is suspended between said two fluorescent members; or a facet without doping unit of said LED member having said flip chip construction is molecular bonded to one of said two fluorescent members, or said LED member having said flip chip construction is fixed to a surface of one of said fluorescent members by die attach epoxy with high light transmission ability and good conductivity.

4. The LED light source, as recited in claim 2, wherein a plurality of said LED members are spacedly provided between said two fluorescent members, wherein a bonding member is peripherally sealed at said peripheral edges of said fluorescent members so as to retain said LED members between said two fluorescent members, wherein a plurality of passage openings are spacedly formed along said bonding member for allowing heat transfer away from said LED members, wherein said fluorescent members comprise a plurality of support members orderly provided between every two adjacent LED members along a surface thereof to retain said LED members in position, wherein an inner gas is used to fill said space between said two fluorescent members.

5. The LED light source, as recited in claim 4, wherein said bonding member is a silica gel which is reflective and comprises an electrode member, said LED members are electrically connected in series or in parallel and said LED members are electrical connected to said electrode member through a gold wire or a copper wire electrically connected to said electrode member, so that p-type doping units and n-type doping units of the two adjacently positioned said LED members are electrically connected.

6. The LED light source, as recited in claim 4, further comprising two position members at two distal ends thereof for clipping said two fluorescent members in position respectively.

7. The LED light source, as recited in claim 5 or claim 6, wherein said LED light source is constructed into a LED light bulb structure comprising a shell body defining a shell cavity having said inner gas inside said shell body, wherein said fluorescent members and said LED members are supported within said shell cavity of said shell body to form a LED light bulb, wherein a space between said fluorescent members are communicated outside to said shell cavity of said shell body through said passage openings.

8. The LED light source, as recited in claim 7, further comprising a light reflective member extended sidewardly from one side of said fluorescent members at a position spacedly extending along said LED light source in such a manner that light emitted from said LED members is guided through a reflective surface of said reflective member to project at a predetermined direction.

* * * * *